US012772860B2

(12) United States Patent
Wang et al.

(10) Patent No.: US 12,772,860 B2
(45) Date of Patent: Oct. 20, 2026

(54) INTEGRATED CIRCUIT SUPPORTS WITH MICROSTRIPS

(71) Applicant: Intel Corporation, Santa Clara, CA (US)

(72) Inventors: Wenzhi Wang, Shanghai (CN); Xiaoning Ye, Portland, OR (US); Yunhui Chu, Hillsboro, OR (US); Chunfei Ye, Lacey, WA (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 606 days.

(21) Appl. No.: 18/260,810

(22) PCT Filed: Feb. 26, 2021

(86) PCT No.: PCT/CN2021/078102
§ 371 (c)(1),
(2) Date: Jul. 10, 2023

(87) PCT Pub. No.: WO2022/178814
PCT Pub. Date: Sep. 1, 2022

(65) Prior Publication Data
US 2024/0088069 A1 Mar. 14, 2024

(51) Int. Cl.

| | |
|---|---|
| ***H10W 44/20*** | (2026.01) |
| ***H10B 80/00*** | (2026.01) |
| ***H10W 70/60*** | (2026.01) |
| ***H10W 70/65*** | (2026.01) |

(Continued)

(52) U.S. Cl.
CPC ............ *H10W 44/20* (2026.01); *H10B 80/00* (2023.02); *H10W 70/611* (2026.01); *H10W 70/65* (2026.01); *H10W 70/685* (2026.01); *H10W 90/00* (2026.01); *H10W 44/216* (2026.01)

(58) Field of Classification Search
CPC . H10W 44/20; H10W 44/216; H10W 70/611; H10W 70/65; H10W 70/685; H10W 70/688; H10W 90/00; H10W 90/701; H10B 80/00; H05K 3/28; H05K 2201/09236; H05K 2201/09409;
(Continued)

(56) References Cited

U.S. PATENT DOCUMENTS 9,478,508 B1 * 10/2016 LaRoche ........... H01L 21/76838
11,756,707 B2 * 9/2023 Jenner ................ H01B 11/1025 174/115
2006/0011275 A1 1/2006 Izumi et al.
(Continued)

FOREIGN PATENT DOCUMENTS

CN 102792784 A 11/2012
CN 103311217 A 9/2013
(Continued)

*Primary Examiner* — Dao H Nguyen
(74) *Attorney, Agent, or Firm* — Akona IP PC

(57) ABSTRACT

Disclosed herein are integrated circuit (IC) supports with microstrips, and related embodiments. For example, an IC support may include a plurality of microstrips and a plurality of conductive segments. Individual ones of the conductive segments may be at least partially over at least two microstrips, a dielectric material may be between the plurality of microstrips and the plurality of conductive segments, and the conductive segments are included in a tape.

20 Claims, 10 Drawing Sheets

(51) Int. Cl.
*H10W 70/685* (2026.01)
*H10W 90/00* (2026.01)

(58) Field of Classification Search
CPC .......... H05K 2201/09781; H05K 2201/10159; H05K 1/0216; H05K 1/0228; H01P 3/081
See application file for complete search history.

(56) References Cited

U.S. PATENT DOCUMENTS

| | | | | |
|---|---|---|---|---|
| 2010/0116521 | A1 | 5/2010 | Nordin et al. | |
| 2010/0300732 | A1 | 12/2010 | Chen | |
| 2012/0228006 | A1 | 9/2012 | Chen | |
| 2013/0234305 | A1* | 9/2013 | Lin | H01L 23/5222 257/664 |
| 2014/0117552 | A1 | 5/2014 | Qian et al. | |
| 2015/0085458 | A1 | 3/2015 | Shibayama et al. | |
| 2015/0371938 | A1 | 12/2015 | Katkar et al. | |
| 2016/0094272 | A1 | 3/2016 | Ye et al. | |
| 2017/0086288 | A1 | 3/2017 | Ouyang et al. | |
| 2019/0045623 | A1* | 2/2019 | Sutono | H05K 1/0216 |
| 2019/0191572 | A1* | 6/2019 | Kunimoto | H05K 3/388 |
| 2020/0083171 | A1* | 3/2020 | Wyland | H01L 24/48 |
| 2020/0413576 | A1 | 12/2020 | Kishi et al. | |
| 2023/0420358 | A1* | 12/2023 | Geyik | H10W 70/05 |
| 2024/0063134 | A1* | 2/2024 | Ye | H01P 3/088 |

FOREIGN PATENT DOCUMENTS

| | | | |
|---|---|---|---|
| CN | 109075419 | A | 12/2018 |
| CN | 111712034 | A | 9/2020 |
| JP | 2004015534 | A | 1/2004 |
| TW | 201244573 | A | 11/2012 |
| WO | 2022178814 | A1 | 9/2022 |
| WO | 2022178822 | A1 | 9/2022 |

* cited by examiner

INTEGRATED CIRCUIT SUPPORTS WITH MICROSTRIPS

CROSS-REFERENCE TO RELATED APPLICATION

This application is a national stage application under 35 U.S.C. § 371 of International Application No. PCT/CN2021/078102 filed 26 Feb. 2021 entitled "INTEGRATED CIRCUIT SUPPORTS WITH MICROSTRIPS," the disclosure of which is considered part of, and is incorporated by reference in, the disclosure of this application.

BACKGROUND

High-speed interconnects in circuit boards may take any of a number of forms. For example, microstrip architectures include a conductive trace spaced apart from a ground plane by a dielectric material, while stripline architectures sandwich a conductive trace between dielectric materials and ground planes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
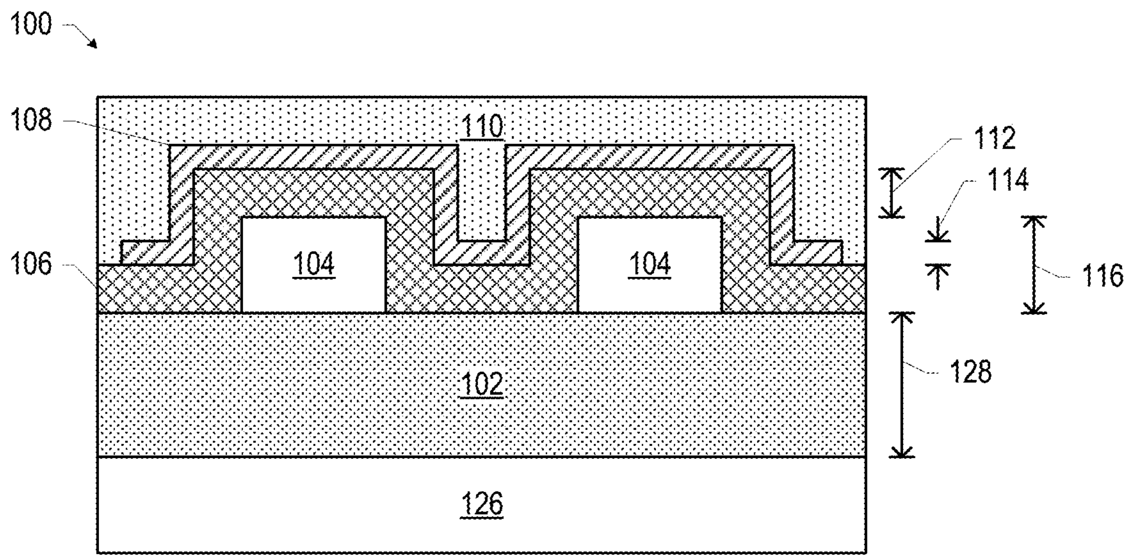
FIGS. 1A-1B are various views of an example integrated circuit (IC) support structure, in accordance with various embodiments.

Disclosed herein are integrated circuit (IC) supports with microstrips, and related embodiments. For example, an IC support may include a plurality of microstrips and a plurality of conductive segments. Individual ones of the conductive segments may be at least partially over at least two microstrips, a dielectric material may be between the plurality of microstrips and the plurality of conductive segments, and the conductive segments are included in a tape.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1B, and the phrase "FIG. 14" may be used to refer to the collection of drawings of FIGS. 14A-14B. As used herein, the term "conductivity" refers to electrical conductivity unless otherwise specified. As used herein, an "IC support structure" refers to a structure that is included in a component that, directly or indirectly, supports an IC device or another electronic device; examples of IC supports that may include any of the IC support structures disclosed herein may include package substrates, interposers, and circuit boards (e.g., motherboards).

Figure 1B:
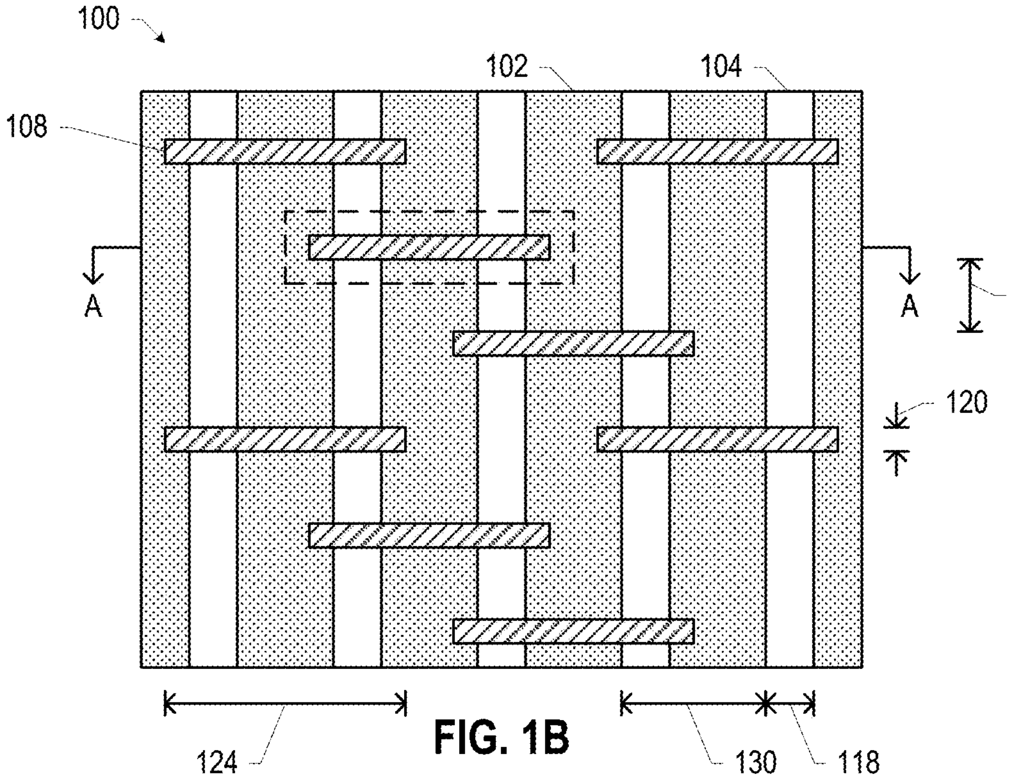

FIG. 1 illustrates an example IC support structure 100, in accordance with various embodiments. In particular, FIG. 1A is a side, cross-sectional view of a portion of an IC support structure 100 (through the section A-A of the dashed line portion of FIG. 1B), while FIG. 1B is a top view of the IC support structure 100 with the dielectric material 110 and the dielectric material 106 removed for clarity of illustration. The IC support structure 100 of FIG. 1 may include multiple microstrips, with each microstrip including a conductive line 104 spaced apart from a ground plane 126 by a dielectric material 102. As shown, a single monolithic ground plane 126 may provide the ground plane 126 for multiple microstrips; similarly, a single monolithic portion of dielectric material 102 may provide the dielectric material 102 for multiple microstrips. In some embodiments, as discussed further below with reference to FIGS. 17-19, the IC support structure 100 may be included in a package substrate or a circuit board. In some such embodiments, the dielectric material 102 may be an organic dielectric material, the ground plane 126 may be a conductive plane (e.g., a copper plane) in one layer of the package substrate/circuit board, and the conductive lines 104 may be conductive lines (e.g., copper lines) in another, adjacent layer of the package substrate/circuit board. More generally, the dielectric material 102 may include any suitable dielectric material 102, and the conductive lines 104 and the ground plane 126 may include any suitable conductive materials. As shown in FIG. 1, an IC support structure 100 may include a plurality of microstrips whose conductive lines 104 are parallel.

A dielectric material 106 may be disposed over the conductive lines 104. In some embodiments, as shown in FIG. 1A, the dielectric material 106 may be conformal over the conductive lines 104, while in other embodiments, the dielectric material 106 may not be conformal over the conductive lines 104 (e.g., as discussed below with reference to FIG. 11). The dielectric material 106 may include any suitable dielectric material. For example, in some embodiments, the dielectric material 106 may be a solder resist material. The dielectric material 106 may be deposited over the entireties of the conductive lines 104 and the exposed surface of the dielectric material 102, or, in some embodiments, may only be located under the conductive segments 108 (between the conductive segments 108 and the conductive lines 104/the exposed surface of the dielectric material 102).

An IC support structure 100 may include one or more conductive segments 108 extending over two or more conductive lines 104. FIG. 1 illustrates an IC support structure 100 including conductive segments 108 at each individually extend over two conductive lines 104, but a conductive segment 108 may extend over more than two conductive lines 104 (e.g., as discussed below with reference to FIGS. 4-5). As shown in FIG. 1A, in some embodiments, a conductive segment 108 may be conformal over the dielectric material 106.

The conductive segments 108 in an IC support structure 100 may serve to reduce the far-end crosstalk between microstrips during operation. Relative to stripline routing (in which a conductive trace is sandwiched between two conductive planes), microstrip routing requires fewer layers in an IC support. However, conventional microstrip routing may suffer from greater far-end crosstalk than stripline routing, which may significantly degrade the signal integrity. Further, this degradation increases as the speed of communication increases. Consequently, conventional microstrip routing may be inadequate to achieve adequate communication speeds and integrity in next-generation devices. The IC support structures 100 disclosed herein may exhibit reduced far-end crosstalk relative to conventional approaches by providing conductive segments 108 that change the mutual capacitance between microstrips and thereby reduce the far-end crosstalk between the microstrips. The amount of mutual capacitance introduced by the conductive segments 108 may be a function of the geometry and dimensions of the IC support structure 100 (as discussed further below), and may be readily tuned during manufacturing, providing good design flexibility (e.g., as discussed further below with reference to FIG. 10). The use of conductive segments 108 to achieve a desired mutual capacitance between microstrips may also avoid the strict manufacturing tolerance control and/or degraded insertion loss performance that is a consequence of some previous approaches.

A conductive segment 108 may include any suitable conductive material. In some embodiments, for example, a conductive segment 108 may include a transition metal carbide that may be conformally patterned at achievable temperatures during printed circuit board (PCB) or package substrate manufacturing operations. The conductive segments 108 may have a conductivity that is close to or less that a conductivity of the conductive lines 104 (e.g., less than half the conductivity of the conductive lines 104, or less than one-tenth the conductivity of the conductive lines 104).

In some embodiments, an additional dielectric material 110 may be disposed over the conductive segments 108. In other embodiments, the dielectric material 110 may not be present, and the conductive segments 108 may be exposed at a surface of an IC support. In some embodiments in which the dielectric material 110 is present, the dielectric material 110 may be a coating to protect the conductive segments 108 and other exposed elements, and may have a different material composition than the dielectric material 102. In some embodiments, the dielectric material 110 may be exposed at a surface of an IC support. In some other embodiments in which the dielectric material 110 is present, the dielectric material 110 may have a same material composition as the dielectric material 102, and further structures (e.g., conductive structures) may be formed on it above that dielectric material 110. In some such embodiments, the IC support structure 100 may be considered to be "embedded" in an IC support. FIG. 1A illustrates an embodiment in which the dielectric material 110 is non-conformal over the conductive segments 108 and other exposed elements, but in other embodiments, the dielectric material 110 may be conformal over the conductive segments 108 and other exposed elements.

The dimensions of the elements of an IC support structure 100 may take any suitable value. In some embodiments, the thickness 128 of the dielectric material 102 may be between 50 microns and 150 microns. In some embodiments, the thickness 112 of the dielectric material 106 (e.g., as measured above the conductive line 104) may be between 10 microns and 40 microns. In some embodiments, the thickness 112 may be less than a thickness 128, while in other embodiments, the thickness 112 may be equal to or greater than the thickness 128. In some embodiments, the thickness 116 of a conductive line 104 may be between 15 microns and 50 microns. In some embodiments, the thickness 114 of a conductive segment 108 may be less than the thickness 116 of a conductive line 104 (e.g., the thickness 114 may be less than half of the thickness 116, less than one-fourth of the thickness 116, or less than one-tenth of the thickness 116). For example, in some embodiments, the thickness 114 may be between 5 microns and 20 microns. In some embodiments, a width 118 of the conductive lines 104 may be between 75 microns and 200 microns. In some embodiments, the pitch 130 of the conductive lines 104 may be between 75 microns and 500 microns. In some embodiments, a width 120 of the conductive segments 108 may be between 75 microns and 200 microns. In some embodiments, a spacing 122 between conductive segments 108 may be between 100 microns and 300 microns. Note that any of these dimensions may be non-uniform across different ones of the corresponding elements. For example, different ones of the conductive segments 108 may have different widths 120 and/or lengths 124, and the spacings 122 may vary.

Similarly, different ones of the conductive lines 104 may have different widths 118, and the pitches 130 may vary.

Figure 2:
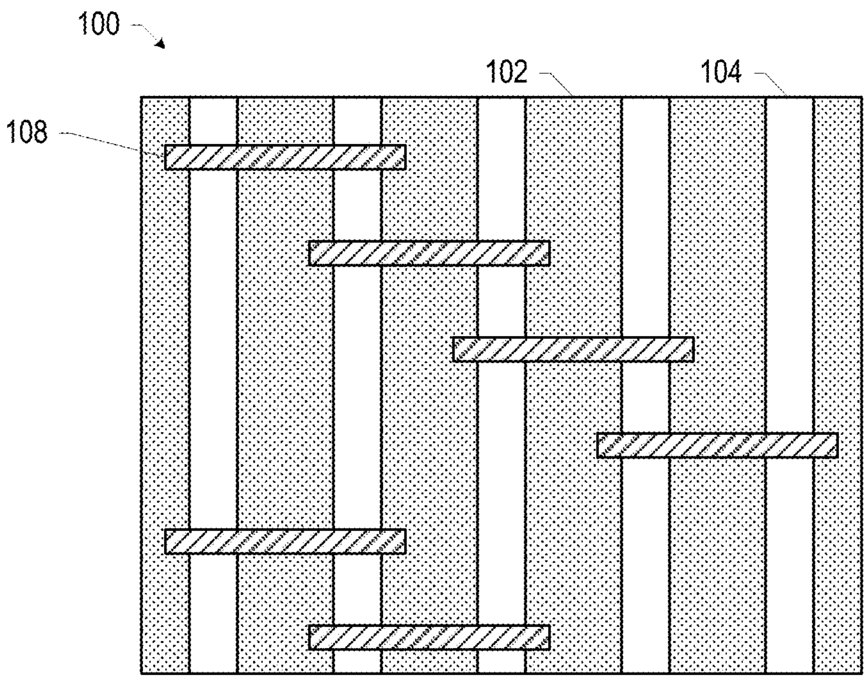
FIGS. 2-10 are top views of example IC support structures, in accordance with various embodiments.
Figure 3:
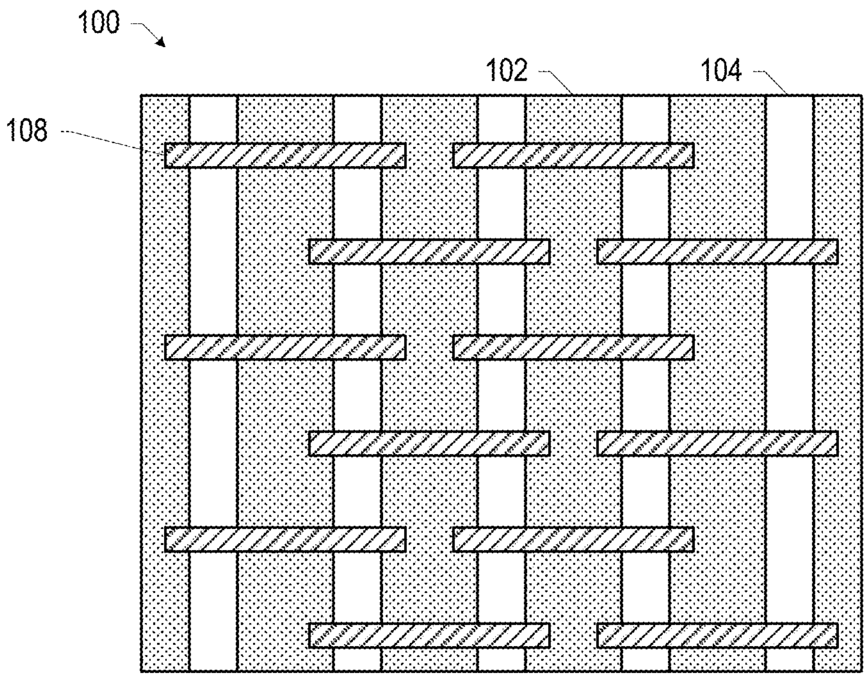

The conductive segments 108 in an IC support structure 100 may be arranged in any desired pattern. FIG. 1B illustrates one particular pattern, while FIGS. 2-10 illustrate different patterns. Any of the IC support structures 100 disclosed herein may include any of the patterns of FIGS. 1-10, and any combination of the patterns of FIGS. 1-10, or any other desired pattern. FIG. 1B illustrates a repeating pattern in which one conductive segment 108 is offset from an adjacent conductive segment 108 such that the two conductive segments 108 both "overlap" one common conductive line 104. FIG. 2 illustrates a similar repeating pattern but in which a next repetition of the pattern is offset farther from an adjacent repetition than is illustrated in the pattern of FIG. 1B; the pattern of FIG. 2 may be referred to as a "ladder offset" pattern. FIG. 3 illustrates a pattern in which individual conductive segments 108 "overlap" two conductive lines 104, with alternating "rows" of conductive segments 108 offset from each other.

Figure 4:
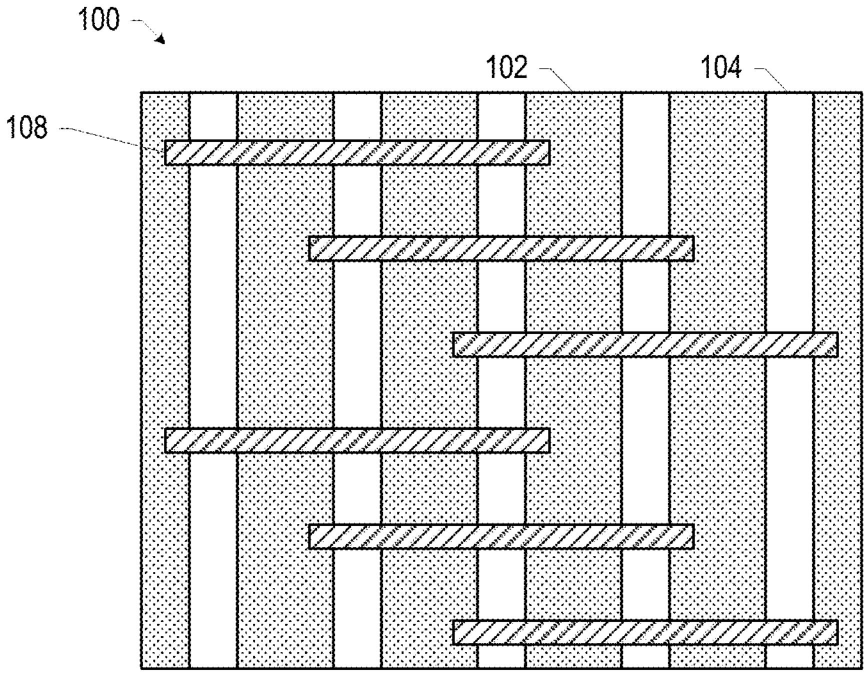
Figure 5:
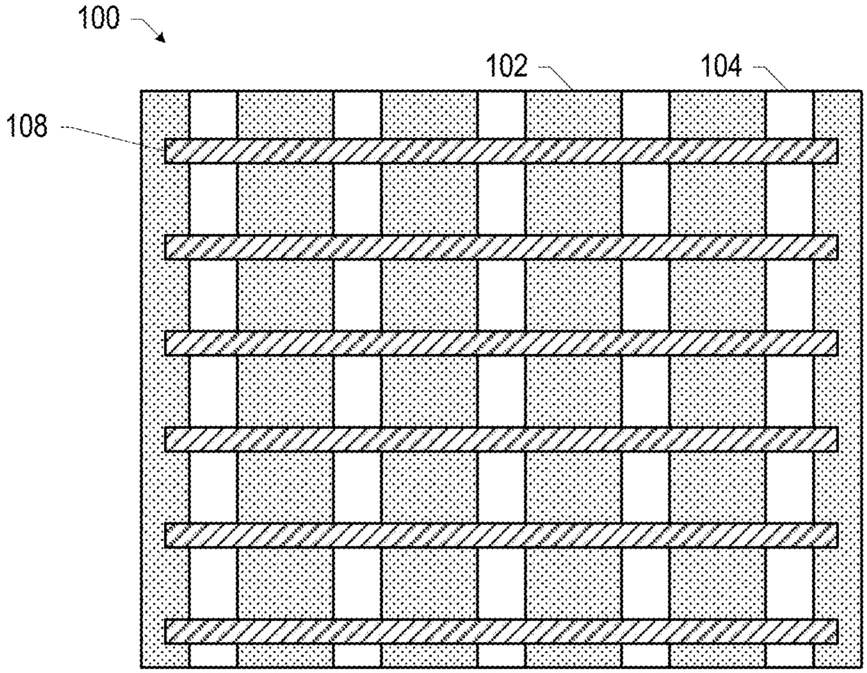

FIG. 4 illustrates another ladder offset pattern, but one in which individual conductive segments 108 "overlap" three conductive lines 104 rather than two conductive lines 104 (as illustrated in FIG. 2); conductive segments 108 in a ladder offset pattern (or any others of the patterns disclosed herein) may "overlap" two or more conductive lines 104, as desired (e.g., to adjust the mutual capacitance of the two or more conductive lines 104). FIG. 5 illustrates a "grid" pattern in which all of the individual conductive segments 108 "overlap" five conductive lines 104; the depiction of five conductive lines 104 in FIG. 5 is simply illustrative, and a grid pattern may include conductive segments 108 "overlapping" any desired number of conductive lines 104.

Figure 6:
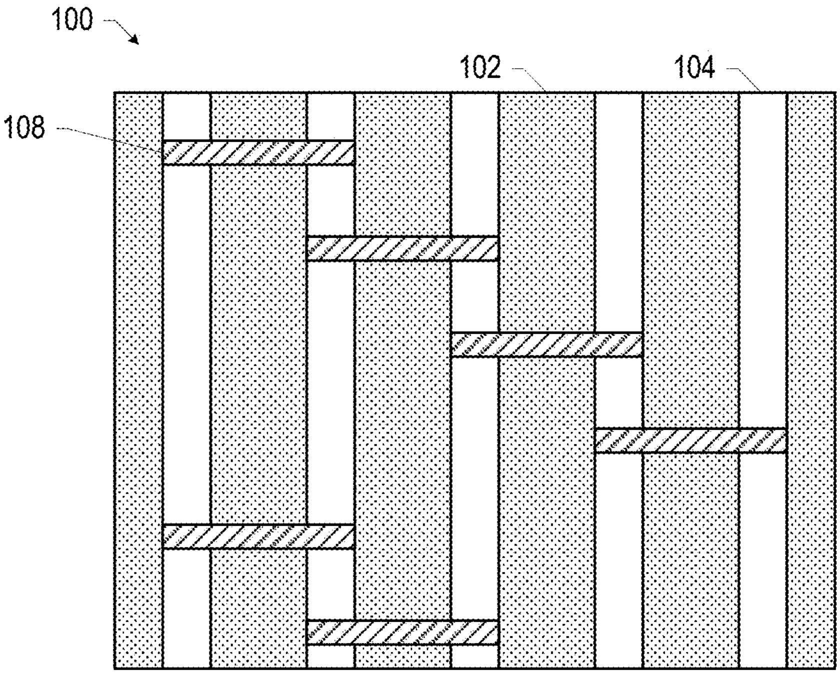
Figure 7:
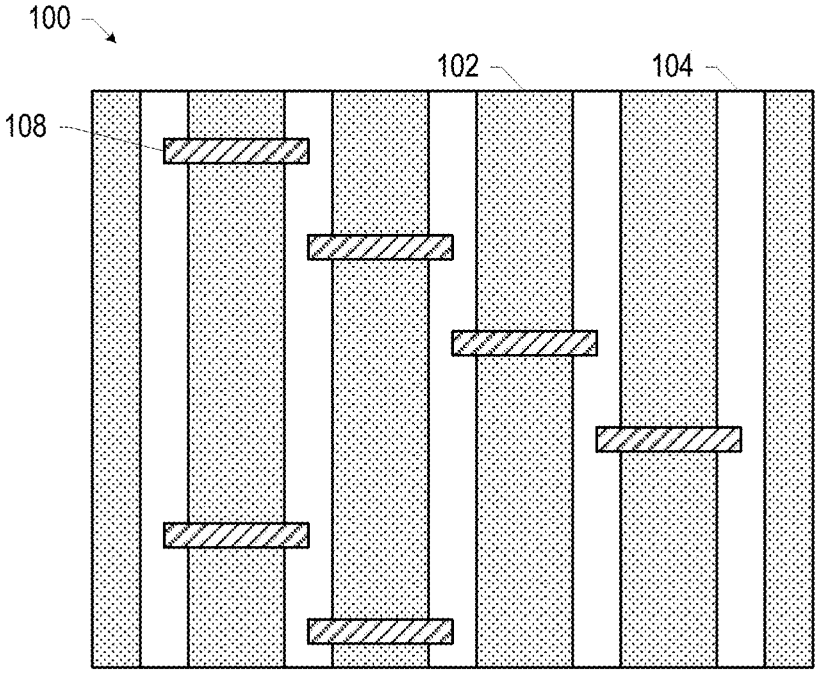

In the embodiments of FIGS. 1-5, the ends of the conductive segments 108 may extend "beyond" the conductive lines 104, but this need not be the case. For example, FIG. 6 illustrates an embodiment similar to that of FIG. 2, but in which the ends of the conductive segments 108 are substantially coplanar with the side faces of the associated conductive lines 104. Similarly, FIG. 7 illustrates an embodiment similar to that of FIG. 6, but in which the ends of the conductive segments 108 are located "over" the associated conductive lines 104 without being coplanar with the side faces of the associated conductive lines 104.

Figure 8:
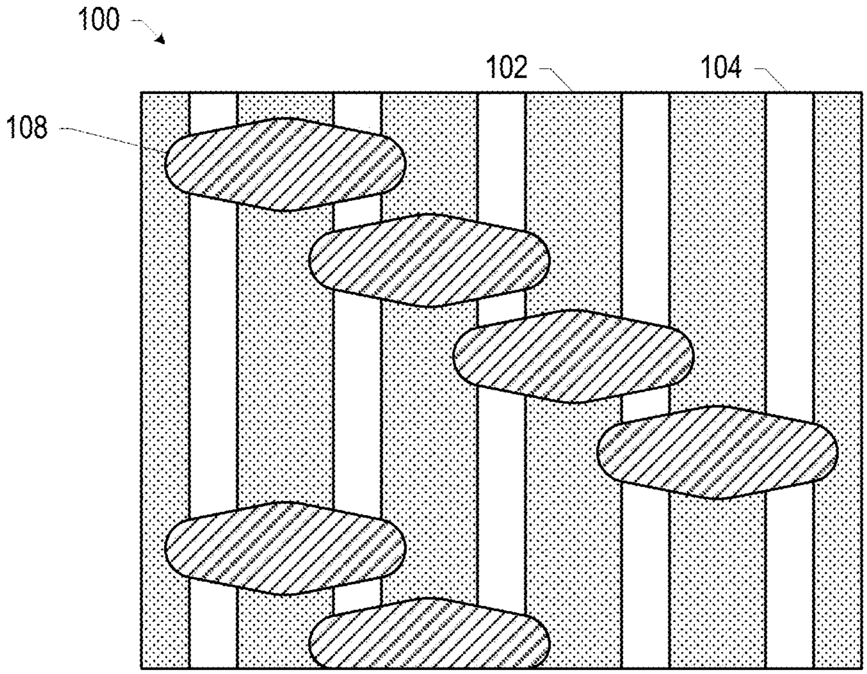

In the embodiments of FIGS. 1-7, the conductive segments 108 have a substantially rectangular footprint, but this need not be the case. For example, FIG. 8 illustrates an embodiment similar to that of FIG. 2, but in which the conductive segments 108 have a rounded diamond footprint. The particular shape of the footprints of the conductive segments 108 of FIG. 8 are simply illustrative, and conductive segments 108 having any desired footprint may be used.

Figure 9:
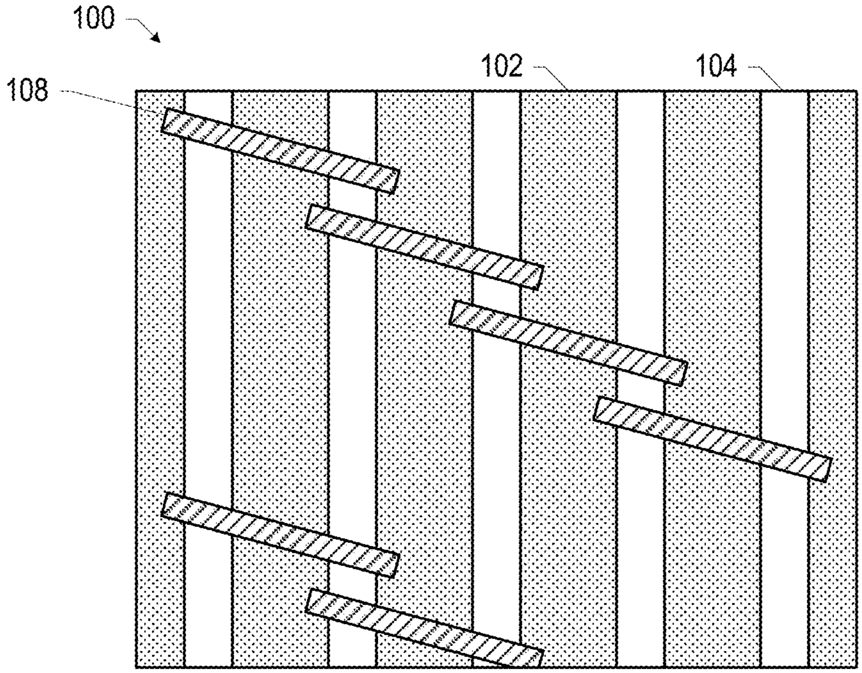

In the embodiments of FIGS. 1-8, the longitudinal axes of the conductive segments 108 have been oriented substantially perpendicular to the longitudinal axes of the conductive lines 104, but this need not be the case. For example, FIG. 9 illustrates an embodiment similar to that of FIG. 2, but in which the longitudinal axes of the conductive segments 108 are not perpendicular to the longitudinal axes of the conductive lines 104. The particular angle and pattern depicted in FIG. 8 is simply illustrative, and conductive segments 108 oriented in any desired angle may be used. Further, although the embodiments of FIGS. 1-9 illustrate repeating patterns with rectangular unit cells, this need not be the case, and a repeating pattern of conductive segments 108 may have unit cells of any shape (e.g., pentagonal, hexagonal, etc.).

Figure 10:
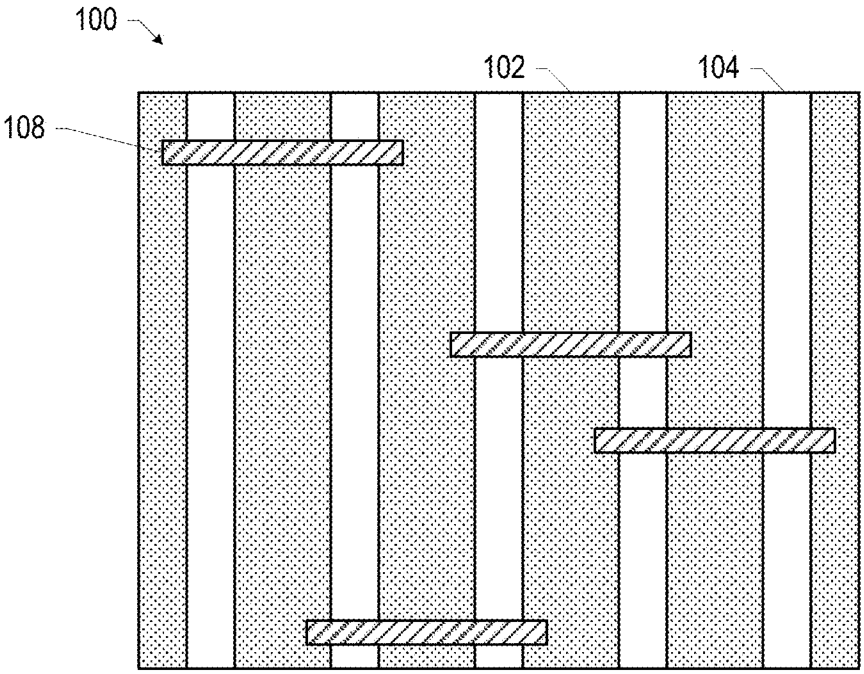

In the embodiments of FIGS. 1-9, the conductive segments 108 are arranged in a substantially regular pattern, but this need not be the case. For example, FIG. 10 illustrates an embodiment similar to that of FIG. 2, but in which some of the conductive segments 108 have been "removed," resulting in an irregular pattern. In a regular pattern of conductive segments 108 may be the result of testing and refining the design of an IC support structure 100 during manufacturing. For example, in some embodiments, an initial IC support structure 100 may be fabricated, having conductive segments 108 arranged in a regular pattern. The properties of that initial IC support structure 100 may be tested, and conductive segments 108 of the initial IC support structure 100 may be removed, shortened, divided into multiple segments, or otherwise modified, and the properties of the modified IC support structure 100 may be tested. When the properties of the modified IC support structure 100 achieve desired targets (e.g., a desired far-end crosstalk), the pattern of the conductive segments 108 in the modified IC support structure 100 may be memorialized and used in the manufacturing of subsequent IC support structures 100. In this manner, the use of conductive segments 108 in an IC support structure 100 may readily support tuning and refinement of the properties of that IC support structure 100 to achieve desired goals for particular applications.

Figure 11:
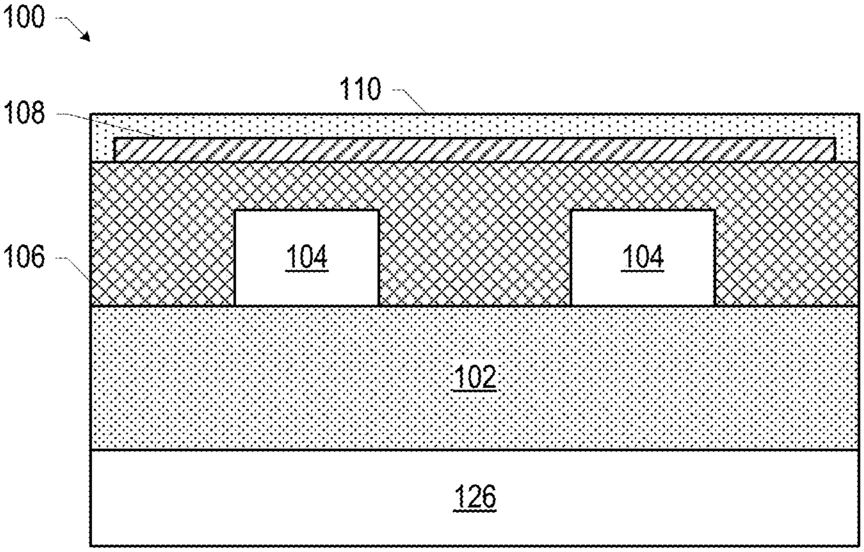
FIG. 11 is a side, cross-sectional view of an example IC support structure, in accordance with various embodiments.

As noted above, in some embodiments, the dielectric material 110 (when present) may be non-conformal over the conductive segments 108. FIG. 11 is a side, cross-sectional view of a portion of an example IC support structure 100 including such a non-conformal dielectric material 110. The side, cross-sectional views illustrated in FIGS. 1A and 11, and others of the embodiments disclosed herein, may be used in combination with any of the patterns of conductive segments 108 illustrated in FIGS. 1B-10, or with any other patterns of conductive segments 108.

Figure 12:
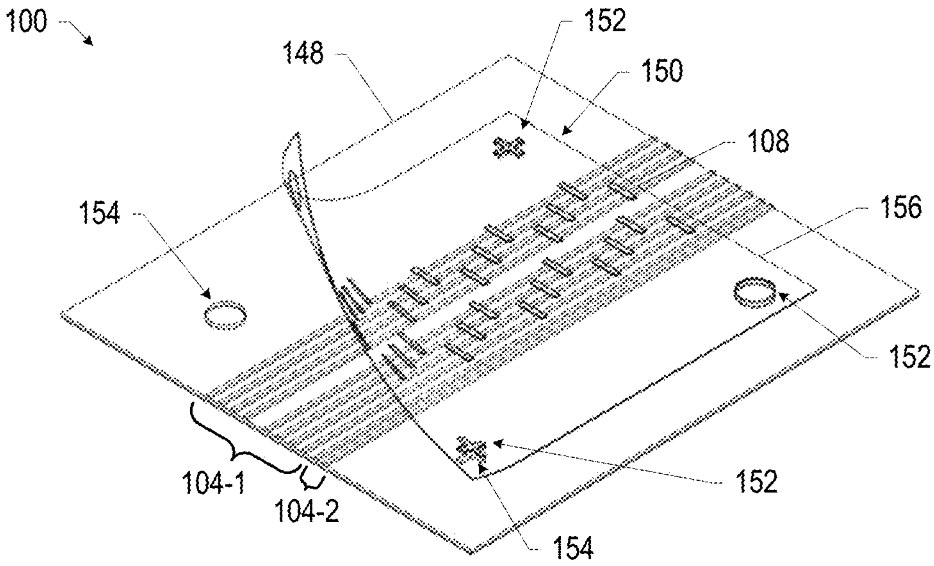
FIG. 12 is a perspective view of an embodiment in which conductive segments of an IC support structure are included in a tape, in accordance with various embodiments.

In some embodiments, the conductive segments 108 may be provided to an IC support structure 100 in the form of a tape. For example, FIG. 12 is a perspective view of an embodiment in which conductive segments 108 of an IC support structure 100 are included in a tape 150, in accordance with various embodiments. The tape 150 may include an adhesive surface that may couple to an underlying structure 148 to form an IC support structure 100. The IC support structure 100 of FIG. 12 includes a number of single-ended conductive lines 104-1 and a pair of differential conductive lines 104-2; conductive segments 108 may extend over any desired combination of single-ended conductive lines 104-1 and/or differential conductive lines 104-2, as desired. The underlying structure 148 may be, for example, a printed circuit board.

The conductive segments 108 may be located on or may be embedded in a film 156. In some embodiments, the conductive segments 108 may be located at the face of the tape 150 closest to the underlying structure 148, and at least part of the dielectric material 110 may be part of the film 156; in such embodiments, the dielectric material 106 may be part of the underlying structure 148, and the conductive segments 108 may be spaced apart from the conductive lines 104 by the dielectric material 106. In some embodiments, the conductive segments 108 may be "embedded" in the film 156 such that at least some of the dielectric material 106 is part of the tape 150, and at least part of the dielectric material 110 is part of the tape 150. In some embodiments, the conductive segments 108 may be located at the face of the tape 150 farthest from the underlying structure 148, and at least part of the dielectric material 106 may be part of the film 156; in such embodiments, some or none of the dielectric material 106 may be part of the underlying structure 148, and a separate dielectric material 110 may or may not be provided.

The tape 150 may include one or more registration features 152, which may correspond to alignment features 154 of the underlying structure 148 and may aid in the accurate placement of the tape 150 on the underlying structure 148. FIG. 12 illustrates cross-shaped and circular registration features 152/154, but any suitable number, shape, and arrangement of alignment features 152/154 may be used. The arrangement of the conductive segments 108 on the tape 150 may correspond to any desired arrangement (e.g., any of the arrangements disclosed herein).

Figure 13:
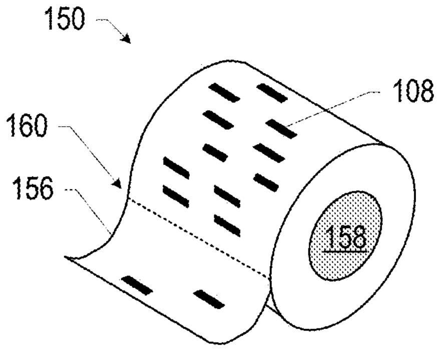
FIG. 13 is a perspective view of a roll of tape including conductive segments, in accordance with various embodiments.

FIG. 13 is a perspective view of a roll of tape 150 including conductive segments 108, in accordance with various embodiments. The roll of tape 150 may be wound around a core 158, and may include perforations 160 that delineate separate portions of the tape 150. During use, a portion of the tape 150 may be separated from the roll at the perforations 160, and that portion of the tape 150 may be applied to an underlying structure 148 (e.g., the underlying structure 148 of FIG. 12) to form an IC support structure 100. Registration features 152 (not shown in FIG. 13 for ease of illustration) may be included in the tape 150 to aid in alignment between the tape 150 and the underlying structure 148, as discussed above. In some embodiments, a tape 150 may have a thickness between 25 microns and 250 microns.

Figure 14A:
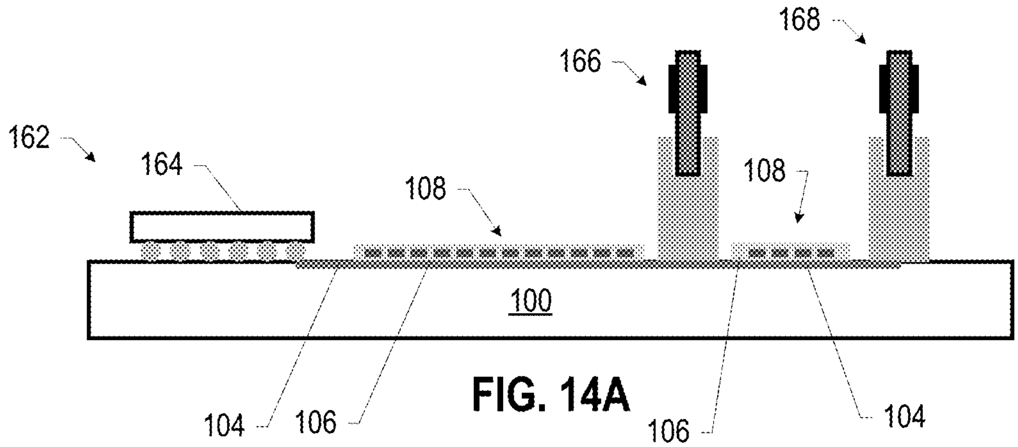
FIGS. 14A and 14B are side and top views, respectively, of an IC assembly including an IC support structure, in accordance with various embodiments.
Figure 14B:
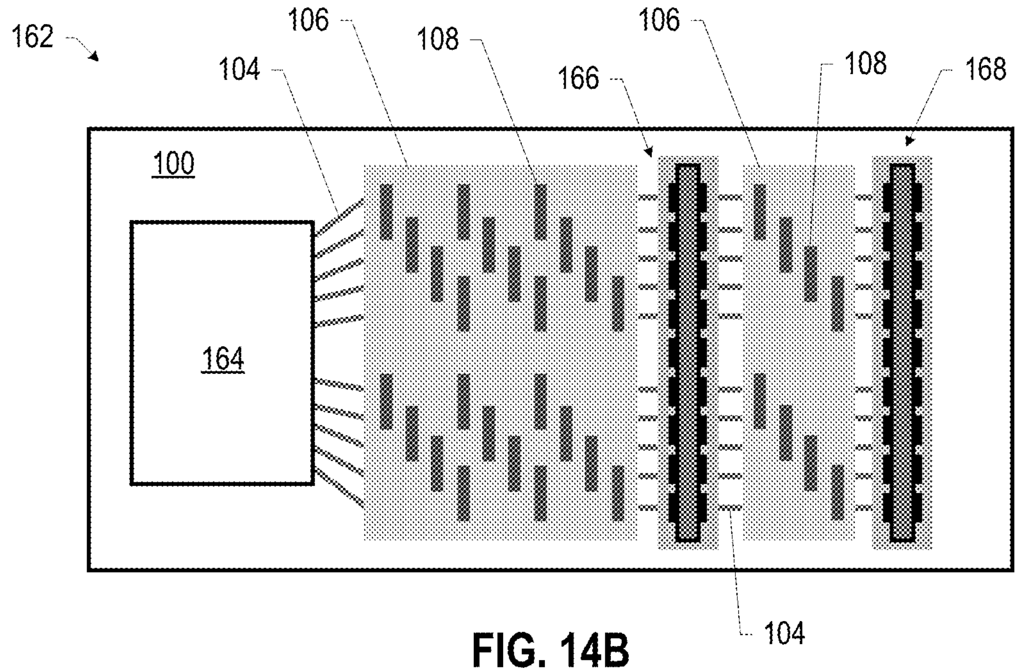

The IC support structures 100 disclosed herein may be included in any desired electronic component. FIGS. 14A and 14B are side and top views, respectively, of an IC assembly 162 including an IC support structure 100, in accordance with various embodiments. The IC assembly 162 may include a first IC device 164 communicatively coupled to a second IC device 166 by conductive lines 104 (which may be part of single-ended and/or differential microstrips, as desired). The IC assembly 162 may also include third IC device 168; the first IC device 164 may be communicatively coupled to the third IC device 168 by conductive lines 104 (which may be part of single-ended and/or differential microstrips, as desired). In some embodiments, the first IC device 164 may include a processing device (e.g., a central processing unit), and the second IC device 166 and the third IC device 168 may include memory devices (e.g., dual inline memory modules). The IC support structure 100 of FIG. 14 may take any of the forms disclosed herein.

As shown in FIG. 14, conductive segments 108 may extend over some or all of the conductive lines 104 of the IC assembly 162 in any desired arrangement (e.g., in any of the arrangements disclosed herein), and the conductive segments may be spaced apart from the conductive lines 104 by a dielectric material 106. In some embodiments, the conductive segments 108 may be included in portions of a tape 150 applied to an underlying structure 148, as discussed above with reference to FIGS. 12-13, to form the IC support structure 100 of FIG. 14.

As noted above, the IC support structures 100 disclosed herein may include or be included in any suitable electronic component. FIGS. 15-19 illustrate various additional examples of apparatuses that may include any of the IC support structures 100 disclosed herein, or may be included in an IC package or assembly that also includes any of the IC support structures 100 disclosed herein.

Figure 15:
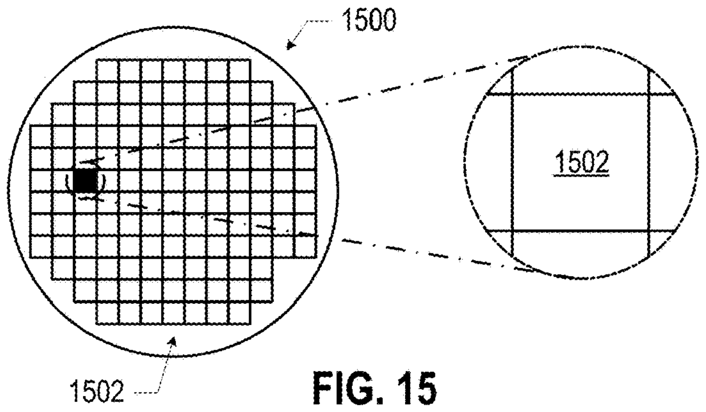
FIG. 15 is a top view of a wafer and dies that may be included in an IC support structure in accordance with any of the embodiments disclosed herein.

FIG. 15 is a top view of a wafer 1500 and dies 1502 that may be included in an IC package or assembly including one or more of IC support structures 100 (e.g., as discussed below with reference to FIGS. 17 and 18) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 16, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 19) or other logic that is configured to store information in the memory devices or execute instructions stored in the memory array.

Figure 16:
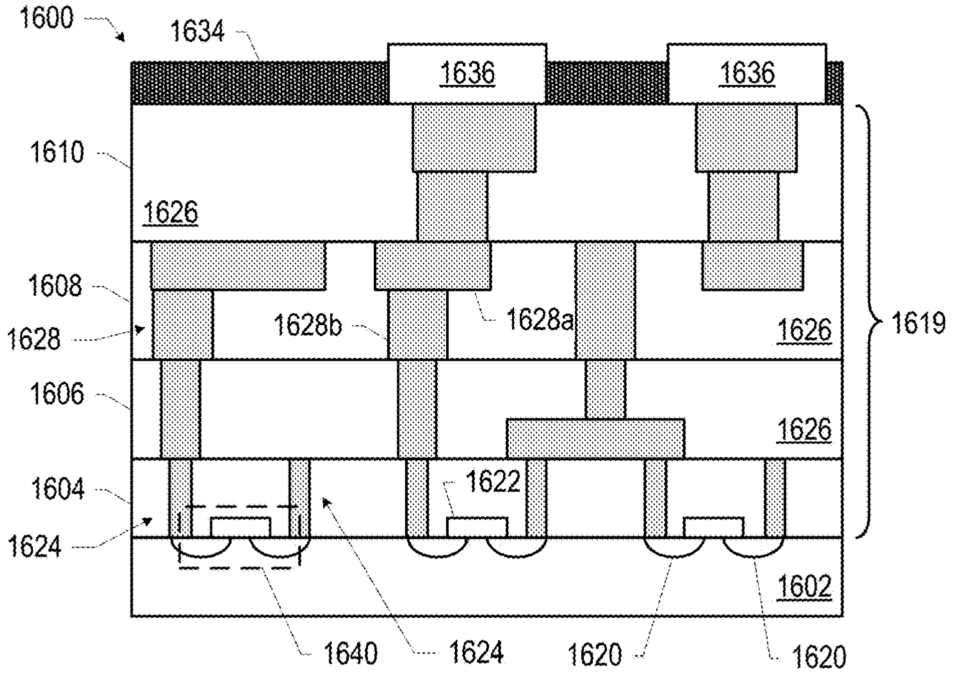
FIG. 16 is a side, cross-sectional view of an IC device that may be included in an IC support structure in accordance with any of the embodiments disclosed herein.

FIG. 16 is a side, cross-sectional view of an IC device 1600 that may be included in an IC package or assembly including one or more IC support structures 100 (e.g., as discussed below with reference to FIGS. 17 and 18), in accordance with any of the embodiments disclosed herein. One or more of the IC devices 1600 may be included in one or more dies 1502 (FIG. 15). The IC device 1600 may be formed on a substrate 1602 (e.g., the wafer 1500 of FIG. 15) and may be included in a die (e.g., the die 1502 of FIG. 15). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 15) or a wafer (e.g., the wafer 1500 of FIG. 15).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 16 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 16 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 16). Although a particular number of interconnect layers 1606-1610 is depicted in FIG. 16, embodiments of the present disclosure include IC devices having more or fewer interconnect layers than depicted.

In some embodiments, the interconnect structures 1628 may include lines **1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 16. The vias 1628***b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 16. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 16, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 17:
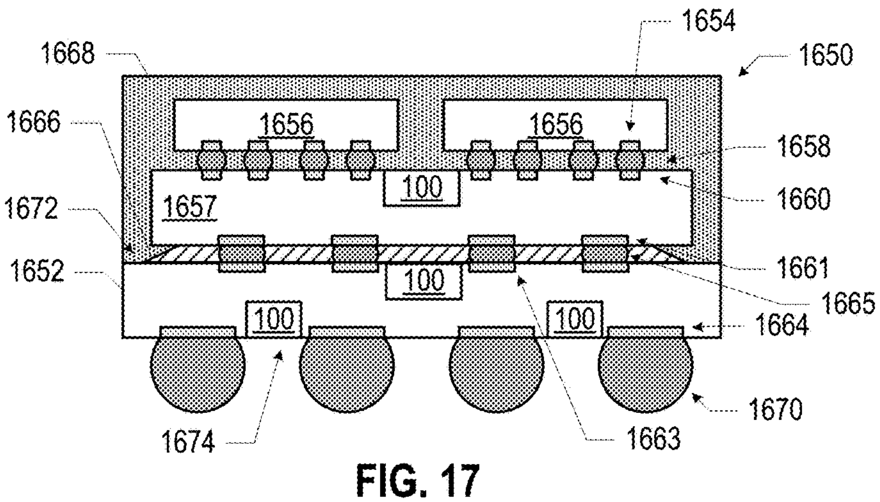
FIG. 17 is a side, cross-sectional view of an IC package that may include an IC support structure in accordance with any of the embodiments disclosed herein.

FIG. 17 is a side, cross-sectional view of an example IC package 1650 that may include one or more IC support structures 100 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 16. The package substrate 1652 may be an IC support, and may include one or more IC support structures 100. FIG. 17 illustrates three IC support structures 100 in the package substrate 1652, but this number and location of IC support structures 100 in the package substrate 1652 is simply illustrative, and any number and arrangement of IC support structures 100 may be included in a package substrate 1652. In some embodiments, one or more IC support structures 100 may be located at a surface of the package substrate 1652 (e.g., a top surface of the package substrate 1652 and/or a bottom surface of the package substrate 1652) and/or may be embedded in the package substrate 1652 and spaced away from a surface. In some embodiments, no IC support structures 100 may be included in a package substrate 1652.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 17 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.). The interposer 1657 may be an IC support, and may include one or more IC support structures 100. FIG. 17 illustrates one IC support structure 100 in the interposer 1657, but this number and location of IC support structures 100 in the interposer 1657 is simply illustrative, and any number and arrangement of IC support structures 100 may be included in an interposer 1657. In some embodiments, one or more IC support structures 100 may be located at a surface of the interposer 1657 (e.g., a top surface of the interposer 1657 and/or a bottom surface of the interposer 1657) and/or may be embedded in the interposer 1657 and spaced away from a surface. In some embodiments, no IC support structures 100 may be included in an interposer 1657.

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 17 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 17 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 18.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 17 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 17, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 18:
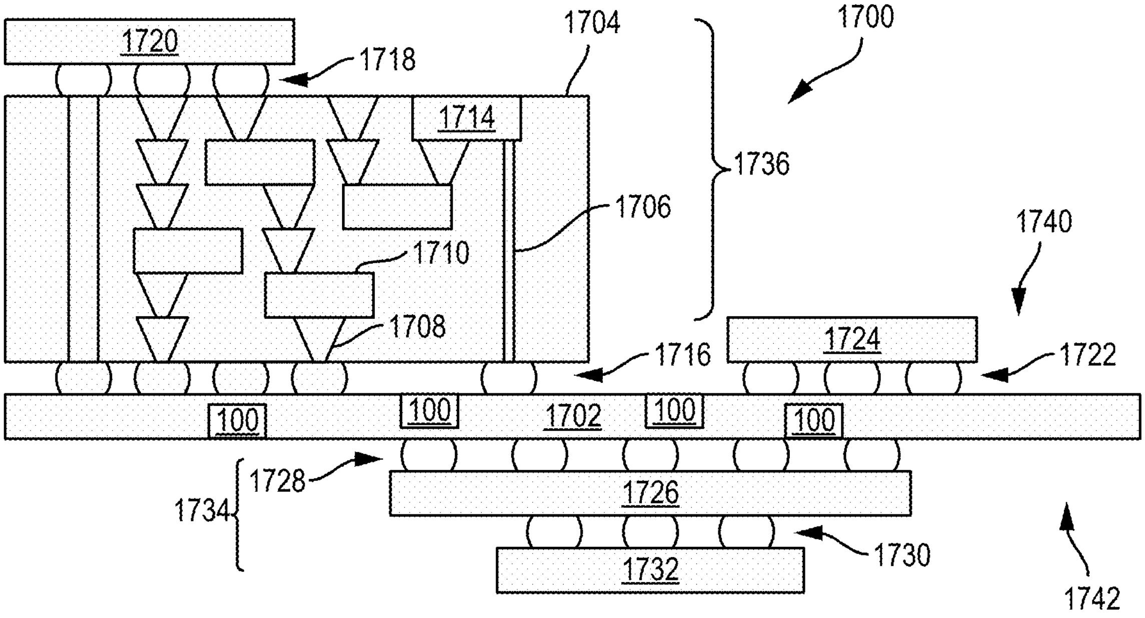
FIG. 18 is a side, cross-sectional view of an IC device assembly that may include an IC support structure in accordance with any of the embodiments disclosed herein.

FIG. 18 is a side, cross-sectional view of an IC device assembly 1700 that may include one or more IC packages or other components (e.g., a circuit board or interposer) including one or more IC support structures 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 17 (e.g., may include one or more IC support structures 100 in a package substrate 1652 or in an interposer 1657).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. The circuit board 1702 may be an IC support, and may include one or more IC support structures 100. FIG. 18 illustrates four IC support structures 100 in the circuit board 1702, but this number and location of IC support structures 100 in the circuit board 1702 is simply illustrative, and any number and arrangement of IC support structures 100 may be included in a circuit board 1702. In some embodiments, one or more IC support structures 100 may be located at a surface of the circuit board 1702 (e.g., a top surface of the circuit board 1702 and/or a bottom surface of the circuit board 1702) and/or may be embedded in the circuit board 1702 and spaced away from a surface.

The IC device assembly 1700 illustrated in FIG. 18 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 18), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 18, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 15), an IC device (e.g., the IC device 1600 of FIG. 16), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 18, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more IC support structures 100 (not shown).

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 18 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 19:
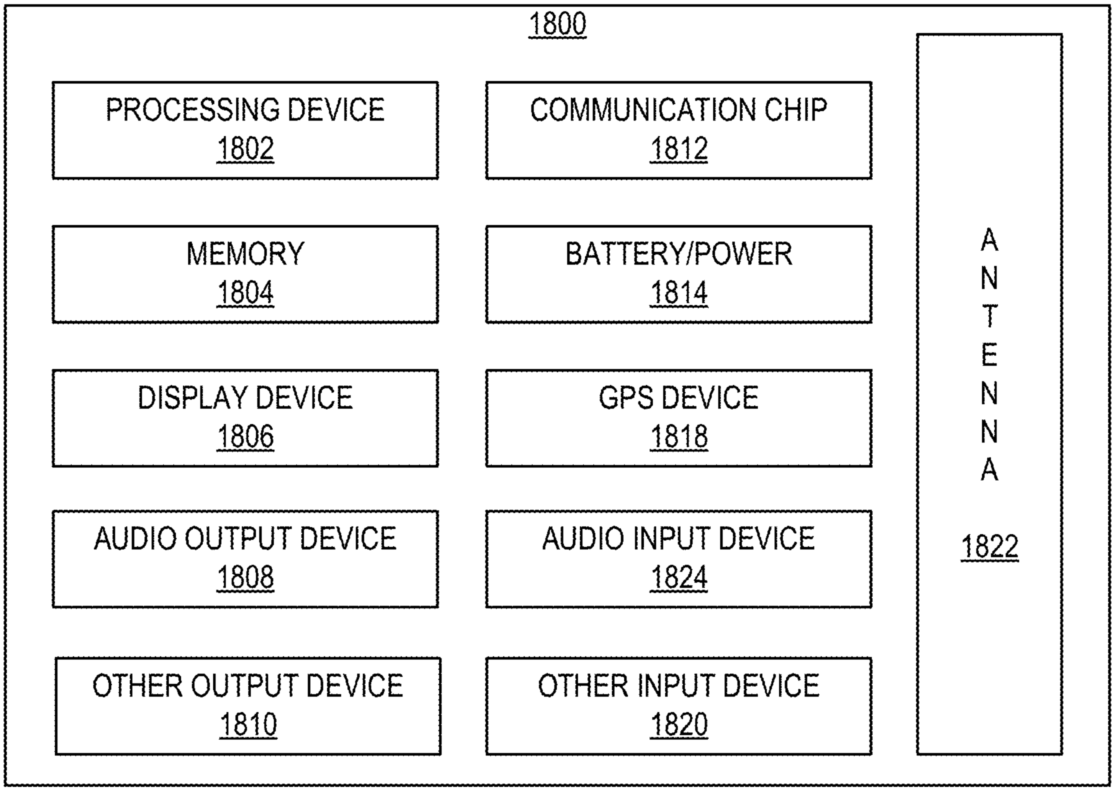
FIG. 19 is a block diagram of an example electrical device that may include an IC support structure in accordance with any of the embodiments disclosed herein.

FIG. 19 is a block diagram of an example electrical device 1800 that may include one or more IC support structures 100 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 19 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 19, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example A1 is an integrated circuit (IC) support, including: a first microstrip, wherein the first microstrip includes a first conductive line, a ground plane, and a first dielectric material between the first conductive line and the ground plane; a second microstrip, wherein the second microstrip includes a second conductive line coplanar with the first conductive line; a second dielectric material at least partially over the first conductive line and the second conductive line; and a conductive segment, wherein the second dielectric material is between the conductive segment and the first conductive line, the second dielectric material is between the conductive segment and the second conductive line, the conductive segment is at least partially over the first conductive line and at least partially over the second conductive line, a thickness of the conductive segment is less than a thickness of the first conductive line, and a conductivity of the conductive segment is less than a conductivity of the first conductive line.

Example A2 includes the subject matter of Example A1, and further specifies that the second dielectric material has a different material composition than the first dielectric material.

Example A3 includes the subject matter of any of Examples A1-2, and further specifies that the thickness of the conductive segment is less than half of the thickness of the first conductive line.

Example A4 includes the subject matter of any of Examples A1-3, and further specifies that a thickness of the second dielectric material is less than a thickness of the first dielectric material.

Example A5 includes the subject matter of any of Examples A1-4, and further specifies that the second dielectric material is conformal over the first conductive line and the second conductive line.

Example A6 includes the subject matter of any of Examples A1-5, and further specifies that the conductive segment is conformal over the second dielectric material.

Example A7 includes the subject matter of any of Examples A1-6, and further specifies that the thickness of the conductive segment is between 5 microns and 20 microns.

Example A8 includes the subject matter of any of Examples A1-7, and further includes: a third dielectric material over the conductive segment.

Example A9 includes the subject matter of Example A8, and further specifies that the third dielectric material has a same material composition as the first dielectric material.

Example A10 includes the subject matter of Example A8, and further specifies that the third dielectric material has a different material composition than the first dielectric material.

Example A11 includes the subject matter of Example A8, and further specifies that the third dielectric material is conformal over the conductive segment.

Example A12 includes the subject matter of any of Examples A8-11, and further specifies that the third dielectric material is at a surface of the IC support.

Example A13 includes the subject matter of any of Examples A1-12, and further specifies that the second dielectric material is a solder mask material.

Example A14 includes the subject matter of any of Examples A1-13, and further specifies that the conductive segment includes a transition metal.

Example A15 includes the subject matter of Example A14, and further specifies that the conductive segment includes carbon.

Example A16 includes the subject matter of any of Examples A1-15, and further specifies that the first conductive line includes copper.

Example A17 includes the subject matter of any of Examples A1-16, and further specifies that the conductivity of the conductive segment is less than half the conductivity of the first conductive line.

Example A18 includes the subject matter of any of Examples A1-17, and further specifies that the conductivity of the conductive segment is less than one-tenth the conductivity of the first conductive line.

Example A19 includes the subject matter of any of Examples A1-18, and further includes: a third microstrip, wherein the third microstrip includes a third conductive line coplanar with the second conductive line such that the second conductive line is between the first conductive line and the third conductive line.

Example A20 includes the subject matter of Example A19, and further specifies that the second dielectric material is between the conductive segment and the third conductive line, and the conductive segment is at least partially over the third conductive line.

Example A21 includes the subject matter of any of Examples A19-20, and further specifies that the conductive segment is a first conductive segment, and the IC support further includes: a second conductive segment, wherein the second dielectric material is between the second conductive segment and the second conductive line, the second dielectric material is between the second conductive segment and the third conductive line, the second conductive segment is at least partially over the second conductive line and at least partially over the third conductive line, a thickness of the second conductive segment is less than a thickness of the first conductive line, and a conductivity of the second conductive segment is less than the conductivity of the first conductive line.

Example A22 includes the subject matter of Example A21, and further specifies that the second conductive segment has a same material composition as the first conductive segment.

Example A23 includes the subject matter of any of Examples A19-22, and further includes: a fourth microstrip, wherein the fourth microstrip includes a fourth conductive line coplanar with the third conductive line such that the third conductive line is between the second conductive line and the fourth conductive line.

Example A24 includes the subject matter of Example A23, and further specifies that the second dielectric material is between the conductive segment and the fourth conductive line, and the conductive segment is at least partially over the fourth conductive line.

Example A25 includes the subject matter of any of Examples A23-24, and further specifies that the conductive segment is a first conductive segment, and the IC support further includes: a third conductive segment, wherein the second dielectric material is between the third conductive segment and the third conductive line, the second dielectric material is between the third conductive segment and the fourth conductive line, the third conductive segment is at least partially over the third conductive line and at least partially over the fourth conductive line, a thickness of the third conductive segment is less than a thickness of the first conductive line, and a conductivity of the third conductive segment is less than the conductivity of the first conductive line.

Example A26 includes the subject matter of Example A25, and further specifies that the third conductive segment has a same material composition as the first conductive segment.

Example A27 includes the subject matter of any of Examples A1-26, and further specifies that the conductive segment is one of a plurality of conductive segments of the IC support, and individual ones of the conductive segments are at least partially over at least two conductive lines of microstrips.

Example A28 includes the subject matter of Example A27, and further specifies that the plurality of conductive segments are arranged in a regular pattern.

Example A29 includes the subject matter of Example A27, and further specifies that the plurality of conductive segments are arranged in an irregular pattern.

Example A30 includes the subject matter of Example A27, and further specifies that the plurality of conductive segments are at least partially arranged in an ladder offset pattern.

Example A31 includes the subject matter of any of Examples A1-30, and further specifies that the IC support includes a package substrate.

Example A32 includes the subject matter of any of Examples A1-31, and further specifies that the IC support includes a circuit board.

Example A33 includes the subject matter of any of Examples A1-32, and further specifies that the first dielectric material includes an organic dielectric material.

Example A34 is an integrated circuit (IC) support, including: a first microstrip, wherein the first microstrip includes a first conductive line, a ground plane, and a first dielectric material between the first conductive line and the ground plane; a second microstrip, wherein the second microstrip includes a second conductive line coplanar with the first conductive line; a third microstrip, wherein the third microstrip includes a third conductive line coplanar with the second conductive line such that the second conductive line is between the first conductive line and the third conductive line; a second dielectric material at least partially over the first conductive line, the second conductive line, and the third conductive line; a first conductive segment, wherein the first conductive segment is spaced apart from the first conductive line and the second conductive line by the second dielectric material, the first conductive segment is at least partially over the first conductive line and at least partially over the second conductive line, and a conductivity of the first conductive segment is less than a conductivity of the first conductive line; and a second conductive segment, wherein the second conductive segment is spaced apart from the second conductive line and the third conductive line by the second dielectric material, the second conductive segment is at least partially over the second conductive line and at least partially over the third conductive line, and a conductivity of the second conductive segment is less than the conductivity of the first conductive line.

Example A35 includes the subject matter of Example A34, and further specifies that the second dielectric material has a different material composition than the first dielectric material.

Example A36 includes the subject matter of any of Examples A34-35, and further specifies that a thickness of the first conductive segment is less than half of a thickness of the first conductive line.

Example A37 includes the subject matter of any of Examples A34-36, and further specifies that a thickness of the second dielectric material is less than a thickness of the first dielectric material.

Example A38 includes the subject matter of any of Examples A34-37, and further specifies that the second dielectric material is conformal over the first conductive line and the second conductive line.

Example A39 includes the subject matter of any of Examples A34-38, and further specifies that the first conductive segment is conformal over the second dielectric material.

Example A40 includes the subject matter of any of Examples A34-39, and further specifies that a thickness of the first conductive segment is between 5 microns and 20 microns.

Example A41 includes the subject matter of any of Examples A34-40, and further includes: a third dielectric material over the first conductive segment and over the second conductive segment.

Example A42 includes the subject matter of Example A41, and further specifies that the third dielectric material has a same material composition as the first dielectric material.

Example A43 includes the subject matter of Example A41, and further specifies that the third dielectric material has a different material composition than the first dielectric material.

Example A44 includes the subject matter of Example A41, and further specifies that the third dielectric material is conformal over the first conductive segment.

Example A45 includes the subject matter of any of Examples A41-44, and further specifies that the third dielectric material is at a surface of the IC support.

Example A46 includes the subject matter of any of Examples A34-45, and further specifies that the second dielectric material is a solder mask material.

Example A47 includes the subject matter of any of Examples A34-46, and further specifies that the first conductive segment includes a transition metal.

Example A48 includes the subject matter of Example A47, and further specifies that the first conductive segment includes carbon.

Example A49 includes the subject matter of any of Examples A34-48, and further specifies that the first conductive line includes copper.

Example A50 includes the subject matter of any of Examples A34-49, and further specifies that the conductivity of the first conductive segment is less than half the conductivity of the first conductive line.

Example A51 includes the subject matter of any of Examples A34-50, and further specifies that the conductivity of the first conductive segment is less than one-tenth the conductivity of the first conductive line.

Example A52 includes the subject matter of any of Examples A34-51, and further specifies that the second conductive segment has a same material composition as the first conductive segment.

Example A53 includes the subject matter of any of Examples A34-52, and further specifies that the first conductive segment and the second conductive segment are two a plurality of conductive segments of the IC support, the plurality of conductive segments includes at least five segments, and individual ones of the conductive segments are at least partially over at least two conductive lines of microstrips.

Example A54 includes the subject matter of Example A53, and further specifies that the plurality of conductive segments are arranged in a regular pattern.

Example A55 includes the subject matter of Example A53, and further specifies that the plurality of conductive segments are arranged in an irregular pattern.

Example A56 includes the subject matter of Example A53, and further specifies that the plurality of conductive segments are at least partially arranged in an ladder offset pattern.

Example A57 includes the subject matter of any of Examples A34-56, and further specifies that the IC support includes a package substrate.

Example A58 includes the subject matter of any of Examples A34-57, and further specifies that the IC support includes a circuit board.

Example A59 includes the subject matter of any of Examples A34-58, and further specifies that the first dielectric material includes an organic dielectric material.

Example A60 is an integrated circuit (IC) support, including: a plurality of microstrips; and a plurality of conductive segments, wherein individual ones of the conductive segments are at least partially over at least two microstrips, a dielectric material is between the plurality of microstrips and the plurality of conductive segments, and an individual conductive segment has a conductivity that is less than a conductivity of a conductive line of an individual microstrip.

Example A61 includes the subject matter of Example A60, and further specifies that the dielectric material is a first dielectric material, individual microstrips include a conductive line spaced apart from a ground plane by a second dielectric material, and the second dielectric material has a different material composition than the first dielectric material.

Example A62 includes the subject matter of Example A61, and further includes: a third dielectric material over the conductive segments.

Example A63 includes the subject matter of Example A62, and further specifies that the third dielectric material has a same material composition as the first dielectric material.

Example A64 includes the subject matter of Example A62, and further specifies that the third dielectric material has a different material composition than the first dielectric material.

Example A65 includes the subject matter of any of Examples A61-64, and further specifies that a thickness of the first dielectric material is less than a thickness of the second dielectric material.

Example A66 includes the subject matter of any of Examples A60-65, and further specifies that a thickness of an individual conductive segment is less than a thickness of a conductive line of an individual microstrip.

Example A67 includes the subject matter of any of Examples A60-66, and further specifies that a thickness of an individual conductive segment is less than half of a thickness of a conductive line of an individual microstrip.

Example A68 includes the subject matter of any of Examples A60-67, and further specifies that the dielectric material is a conformal layer.

Example A69 includes the subject matter of any of Examples A60-68, and further specifies that individual conductive segments are conformal over the dielectric material.

Example A70 includes the subject matter of any of Examples A60-69, and further specifies that a thickness of an individual conductive segment is between 5 microns and 20 microns.

Example A71 includes the subject matter of any of Examples A60-70, and further includes: a third dielectric material over the conductive segments.

Example A72 includes the subject matter of Example A71, and further specifies that the third dielectric material is conformal over the conductive segments.

Example A73 includes the subject matter of any of Examples A60-72, and further specifies that the dielectric material is a solder mask material.

Example A74 includes the subject matter of any of Examples A60-73, and further specifies that an individual conductive segment includes a transition metal.

Example A75 includes the subject matter of Example A74, and further specifies that an individual conductive segment includes carbon.

Example A76 includes the subject matter of any of Examples A60-75, and further specifies that the conductive line includes copper.

Example A77 includes the subject matter of any of Examples A60-76, and further specifies that the conductivity of the individual conductive segment is less than half the conductivity of the conductive line.

Example A78 includes the subject matter of any of Examples A60-77, and further specifies that the conductivity of the individual conductive segment is less than one-tenth the conductivity of the conductive line.

Example A79 includes the subject matter of any of Examples A60-78, and further specifies that the plurality of conductive segments are arranged in a regular pattern.

Example A80 includes the subject matter of any of Examples A60-78, and further specifies that the plurality of conductive segments are arranged in an irregular pattern.

Example A81 includes the subject matter of any of Examples A60-78, and further specifies that the plurality of conductive segments are at least partially arranged in a ladder offset pattern.

Example A82 includes the subject matter of any of Examples A60-81, and further specifies that the IC support includes a package substrate.

Example A83 includes the subject matter of any of Examples A60-82, and further specifies that the IC support includes a circuit board.

Example A84 includes the subject matter of any of Examples A60-83, and further specifies that the first dielectric material includes an organic dielectric material.

Example A85 is an electronic device, including: an integrated circuit (IC) device; and an IC support coupled to the IC device, wherein the IC support includes any of the IC supports of any of Examples A1-84.

Example A86 includes the subject matter of Example A85, and further specifies that the electronic device is a handheld computing device, a laptop computing device, a wearable computing device, or a server computing device.

Example A87 includes the subject matter of any of Examples A85-86, and further specifies that the IC support includes a motherboard.

Example A88 includes the subject matter of any of Examples A85-87, and further includes: a display communicatively coupled to the IC support.

Example A89 includes the subject matter of Example A88, and further specifies that the display includes a touchscreen display.

Example A90 includes the subject matter of any of Examples A85-89, and further includes: a housing around the IC support and the IC device.

Example A91 is a method of manufacturing an integrated circuit (IC) support, including any of the methods disclosed herein.

Example A92 is a method of modifying an integrated circuit (IC) support, including any of the methods disclosed herein.

Example B1 is an integrated circuit (IC) support, including: a first microstrip, wherein the first microstrip includes a first conductive line, a ground plane, and a first dielectric material between the first conductive line and the ground plane; a second microstrip, wherein the second microstrip includes a second conductive line coplanar with the first conductive line; a second dielectric material at least partially over the first conductive line and the second conductive line; and a conductive segment, wherein the second dielectric material is between the conductive segment and the first conductive line, the second dielectric material is between the conductive segment and the second conductive line, the conductive segment is at least partially over the first conductive line and at least partially over the second conductive line, and the conductive segment is included in a tape.

Example B2 includes the subject matter of Example B1, and further specifies that the second dielectric material has a different material composition than the first dielectric material.

Example B3 includes the subject matter of any of Examples B1-2, and further specifies that a thickness of the conductive segment is less than half of a thickness of the first conductive line.

Example B4 includes the subject matter of any of Examples B1-3, and further specifies that a thickness of the second dielectric material is less than a thickness of the first dielectric material.

Example B5 includes the subject matter of any of Examples B1-4, and further specifies that at least some of the second dielectric material is included in the tape.

Example B6 includes the subject matter of any of Examples B1-5, and further specifies that some of the second dielectric material is included in the tape, and some of the second dielectric material is not included in the tape.

Example B7 includes the subject matter of any of Examples B1-6, and further specifies that the thickness of the conductive segment is between 5 microns and 20 microns.

Example B8 includes the subject matter of any of Examples B1-7, and further includes: a third dielectric material over the conductive segment.

Example B9 includes the subject matter of Example B8, and further specifies that the third dielectric material has a same material composition as the first dielectric material.

Example B10 includes the subject matter of Example B8, and further specifies that the third dielectric material has a different material composition than the first dielectric material.

Example B11 includes the subject matter of Example B8, and further specifies that the third dielectric material is included in the tape.

Example B12 includes the subject matter of any of Examples B8-11, and further specifies that the third dielectric material is at a surface of the IC support.

Example B13 includes the subject matter of any of Examples B1-12, and further specifies that the second dielectric material is a solder mask material.

Example B14 includes the subject matter of any of Examples B1-13, and further specifies that the conductive segment includes a transition metal.

Example B15 includes the subject matter of Example B14, and further specifies that the conductive segment includes carbon.

Example B16 includes the subject matter of any of Examples B1-15, and further specifies that the first conductive line includes copper.

Example B17 includes the subject matter of any of Examples B1-16, and further specifies that the conductivity of the conductive segment is less than half the conductivity of the first conductive line.

Example B18 includes the subject matter of any of Examples B1-17, and further specifies that the conductivity of the conductive segment is less than one-tenth the conductivity of the first conductive line.

Example B19 includes the subject matter of any of Examples B1-18, and further includes: a third microstrip, wherein the third microstrip includes a third conductive line coplanar with the second conductive line such that the second conductive line is between the first conductive line and the third conductive line.

Example B20 includes the subject matter of Example B19, and further specifies that the second dielectric material is between the conductive segment and the third conductive line, and the conductive segment is at least partially over the third conductive line.

Example B21 includes the subject matter of any of Examples B19-20, and further specifies that the conductive segment is a first conductive segment, and the IC support further includes: a second conductive segment, wherein the second dielectric material is between the second conductive segment and the second conductive line, the second dielectric material is between the second conductive segment and the third conductive line, the second conductive segment is at least partially over the second conductive line and at least partially over the third conductive line, and the second conductive segment is included in the tape.

Example B22 includes the subject matter of Example B21, and further specifies that the second conductive segment has a same material composition as the first conductive segment.

Example B23 includes the subject matter of any of Examples B19-22, and further includes: a fourth microstrip, wherein the fourth microstrip includes a fourth conductive line coplanar with the third conductive line such that the third conductive line is between the second conductive line and the fourth conductive line.

Example B24 includes the subject matter of Example B23, and further specifies that the second dielectric material is between the conductive segment and the fourth conductive line, and the conductive segment is at least partially over the fourth conductive line.

Example B25 includes the subject matter of any of Examples B23-24, and further specifies that the conductive segment is a first conductive segment, and the IC support further includes: a third conductive segment, wherein the second dielectric material is between the third conductive segment and the third conductive line, the second dielectric material is between the third conductive segment and the fourth conductive line, the third conductive segment is at least partially over the third conductive line and at least partially over the fourth conductive line, and the third conductive segment is included in the tape.

Example B26 includes the subject matter of Example B25, and further specifies that the third conductive segment has a same material composition as the first conductive segment.

Example B27 includes the subject matter of any of Examples B1-26, and further specifies that the conductive segment is one of a plurality of conductive segments included in the tape, and individual ones of the conductive segments are at least partially over at least two conductive lines of microstrips.

Example B28 includes the subject matter of Example B27, and further specifies that the plurality of conductive segments are arranged in a regular pattern.

Example B29 includes the subject matter of Example B27, and further specifies that the plurality of conductive segments are arranged in an irregular pattern.

Example B30 includes the subject matter of Example B27, and further specifies that the plurality of conductive segments are at least partially arranged in an ladder offset pattern.

Example B31 includes the subject matter of any of Examples B1-30, and further specifies that the IC support includes a package substrate.

Example B32 includes the subject matter of any of Examples B1-31, and further specifies that the IC support includes a circuit board.

Example B33 includes the subject matter of any of Examples B1-32, and further specifies that the first dielectric material includes an organic dielectric material.

Example B34 is a tape for use in an integrated circuit (IC) support, including: a first conductive segment, wherein, when the tape is applied to an underlying structure including a first conductive line, a second conductive line, and a third conductive line, the first conductive segment is at least partially over the first conductive line and at least partially over the second conductive line; and a second conductive segment, wherein, when the tape is applied to the underlying structure, the second conductive segment is at least partially over the second conductive line and at least partially over the third conductive line.

Example B35 includes the subject matter of Example B34, and further specifies that a conductivity of the first conductive segment is less than a conductivity of the first conductive line.

Example B36 includes the subject matter of any of Examples B34-35, and further specifies that a conductivity of the second conductive segment is less than the conductivity of the first conductive line.

Example B37 includes the subject matter of any of Examples B34-36, and further includes: a dielectric material, wherein, when the tape is applied to the underlying structure, (1) the first conductive segment is spaced apart from the first conductive line and the second conductive line by the dielectric material; and (2) the second conductive segment is spaced apart from the second conductive line and the third conductive line by the dielectric material.

Example B38 includes the subject matter of any of Examples B34-37, and further includes: an adhesive surface.

Example B39 includes the subject matter of any of Examples B34-38, and further includes: perforations defining ends of portions of the tape.

Example B40 includes the subject matter of any of Examples B34-39, and further specifies that the tape is wound around a core.

Example B41 includes the subject matter of any of Examples B34-40, and further specifies that a thickness of the first conductive segment is between 5 microns and 20 microns.

Example B42 includes the subject matter of any of Examples B34-40, and further includes: a dielectric material, wherein, when the tape is applied to the underlying structure, (1) the first conductive segment is between the dielectric material and the first conductive line; and (2) the second conductive segment is between the dielectric material and the second conductive line.

Example B43 includes the subject matter of any of Examples B34-42, and further specifies that the first conductive segment includes a transition metal.

Example B44 includes the subject matter of any of Examples B34-42, and further specifies that the first conductive segment includes carbon.

Example B45 includes the subject matter of any of Examples B34-44, and further specifies that the first conductive segment and the second conductive segment are two a plurality of conductive segments of the tape, the plurality of conductive segments includes at least five segments, and, when the tape is applied to the underlying structure, individual ones of the conductive segments are at least partially over at least two conductive lines of the underlying structure.

Example B46 includes the subject matter of Example B45, and further specifies that the plurality of conductive segments are arranged in a regular pattern.

Example B47 includes the subject matter of Example B45, and further specifies that the plurality of conductive segments are arranged in an irregular pattern.

Example B48 includes the subject matter of Example B45, and further specifies that the plurality of conductive segments are at least partially arranged in an ladder offset pattern.

Example B49 is an electronic device, including an integrated circuit (IC) device and an IC support coupled to the IC device, wherein the IC support includes: a plurality of microstrips, and a plurality of conductive segments, wherein individual ones of the conductive segments are at least partially over at least two microstrips, a dielectric material is between the plurality of microstrips and the plurality of conductive segments, and the plurality of conductive segments are included in a tape.

Example B50 includes the subject matter of Example B49, and further specifies that an individual conductive segment has a conductivity that is less than a conductivity of a conductive line of an individual microstrip.

Example B51 includes the subject matter of any of Examples B49-50, and further specifies that the IC device is a first IC device, and the plurality of microstrips communicatively couple the first IC device to a second IC device.

Example B52 includes the subject matter of Example B51, and further specifies that the first IC device is a processing device.

Example B53 includes the subject matter of Example B52, and further specifies that the first IC device is a central processing unit.

Example B54 includes the subject matter of any of Examples B51-53, and further specifies that the second IC device is a memory device.

Example B55 includes the subject matter of Example B54, and further specifies that the second IC device is a dual in-line memory module.

Example B56 includes the subject matter of any of Examples B49-55, and further specifies that the tape has a thickness between 25 microns and 250 microns.

Example B57 includes the subject matter of any of Examples B49-56, and further specifies that the electronic device is a handheld computing device, a laptop computing device, a wearable computing device, or a server computing device.

Example B58 includes the subject matter of any of Examples B49-57, and further specifies that the IC support includes a motherboard.

Example B59 includes the subject matter of any of Examples B49-58, and further includes: a display communicatively coupled to the IC support.

Example B60 includes the subject matter of Example B59, and further specifies that the display includes a touchscreen display.

Example B61 includes the subject matter of any of Examples B49-60, and further includes: a housing around the IC support and the IC device.

The invention claimed is:

1. An integrated circuit (IC) component, comprising:
- a first microstrip, wherein the first microstrip includes a first conductive line, a ground plane, and a first dielectric material between the first conductive line and the ground plane;
- a second microstrip, wherein the second microstrip includes a second conductive line coplanar with the first conductive line;
- a second dielectric material at least partially over the first conductive line and the second conductive line; and
- a conductive segment, wherein the second dielectric material is between the conductive segment and the first conductive line, the second dielectric material is between the conductive segment and the second conductive line, the conductive segment is at least partially over the first conductive line and at least partially over the second conductive line, the conductive segment is included in a tape, and the first conductive line and the second conductive line are external to the tape.

2. The IC component of claim 1, wherein at least some of the second dielectric material is included in the tape.

3. The IC component of claim 1, wherein some of the second dielectric material is included in the tape, and some of the second dielectric material is not included in the tape.

4. The IC component of claim 1, wherein a thickness of the conductive segment is between 5 microns and 20 microns.

5. The IC component of claim 1, further comprising:
- a third dielectric material over the conductive segment.

6. The IC component of claim 5, wherein the third dielectric material is included in the tape.

7. The IC component of claim 1, further comprising:
- a third microstrip, wherein the third microstrip includes a third conductive line coplanar with the second conductive line such that the second conductive line is between the first conductive line and the third conductive line.

8. The IC component of claim 7, wherein the conductive segment is a first conductive segment, and the IC component further includes:

a second conductive segment, wherein the second dielectric material is between the second conductive segment and the second conductive line, the second dielectric material is between the second conductive segment and the third conductive line, the second conductive segment is at least partially over the second conductive line and at least partially over the third conductive line, and the second conductive segment is included in the tape.

9. A tape for use in an integrated circuit (IC) support, comprising:

a first conductive segment, wherein, when the tape is applied to an underlying structure including a first conductive line, a second conductive line, and a third conductive line, the first conductive segment is at least partially over the first conductive line and at least partially over the second conductive line, wherein a conductivity of the first conductive segment is less than a conductivity of the first conductive line; and a second conductive segment, wherein, when the tape is applied to the underlying structure, the second conductive segment is at least partially over the second conductive line and at least partially over the third conductive line.

10. The tape of claim 9, wherein a conductivity of the second conductive segment is less than the conductivity of the first conductive line.

11. The tape of claim 9, further comprising:

a dielectric material, wherein, when the tape is applied to the underlying structure:

the first conductive segment is spaced apart from the first conductive line and the second conductive line by the dielectric material; and the second conductive segment is spaced apart from the second conductive line and the third conductive line by the dielectric material.

12. The tape of claim 9, further comprising:

an adhesive surface.

13. The tape of claim 9, further comprising:

perforations defining ends of portions of the tape.

14. The tape of claim 9, wherein the tape is wound around a core.

15. The tape of claim 9, wherein the underlying structure is not part of the tape.

16. An electronic device, comprising:

an integrated circuit (IC) device; and an IC structure coupled to the IC device, wherein the IC structure includes:

a plurality of microstrips, and a plurality of conductive segments, wherein individual ones of the conductive segments are at least partially over at least two microstrips, a dielectric material is between the plurality of microstrips and the plurality of conductive segments, the plurality of conductive segments are included in a tape, and the plurality of microstrips are not included in the tape.

17. The electronic device of claim 16, wherein the IC device is a first IC device, and the plurality of microstrips communicatively couple the first IC device to a second IC device.

18. The electronic device of claim 17, wherein the first IC device is a processing device.

19. The electronic device of claim 17, wherein the second IC device is a memory device.

20. The electronic device of claim 16, wherein the tape has a thickness between 25 microns and 250 microns.

* * * * *